United States Patent
Matsumoto et al.

(10) Patent No.: US 7,292,172 B2
(45) Date of Patent: Nov. 6, 2007

(54) CURRENT DRIVEN D/A CONVERTER AND ITS BIAS CIRCUIT

(75) Inventors: Osamu Matsumoto, Tokyo (JP); Takahiro Miki, Tokyo (JP); Yasuo Morimoto, Tokyo (JP)

(73) Assignee: Renesas Technology Corp., Chiyoda-Ku, Tokyo (JP)

( * ) Notice: Subject to any disclaimer, the term of this patent is extended or adjusted under 35 U.S.C. 154(b) by 28 days.

(21) Appl. No.: 11/214,723

(22) Filed: Aug. 31, 2005

(65) Prior Publication Data
US 2006/0044169 A1   Mar. 2, 2006

(30) Foreign Application Priority Data
Aug. 31, 2004 (JP) .............................. 2004-252939

(51) Int. Cl.
*H03M 1/66* (2006.01)
(52) U.S. Cl. ................. 341/144; 341/135; 341/136
(58) Field of Classification Search ........ 341/134–136, 341/144–154
See application file for complete search history.

(56) References Cited

U.S. PATENT DOCUMENTS

| | | | |
|---|---|---|---|
| 5,148,164 A | | 9/1992 | Nakamura et al. |
| 5,825,317 A * | 10/1998 | Anderson et al. ............ 341/120 |
| 6,166,670 A * | 12/2000 | O'Shaughnessy ........... 341/136 |
| 6,304,201 B1 * | 10/2001 | Moreland et al. ........... 341/154 |
| 6,353,402 B1 * | 3/2002 | Kanamori ................... 341/118 |
| 6,518,906 B2 * | 2/2003 | Abel et al. ................... 341/144 |
| 6,967,609 B1 * | 11/2005 | Bicakci et al. .............. 341/144 |
| 6,975,132 B2 * | 12/2005 | Groen et al. ................. 326/27 |
| 7,002,500 B2 * | 2/2006 | Li .............................. 341/144 |
| 7,019,676 B2 * | 3/2006 | Ikoma et al. ................ 341/144 |
| 7,061,306 B2 * | 6/2006 | Nazarian et al. ............ 327/536 |
| 7,068,201 B1 * | 6/2006 | Chou .......................... 341/144 |
| 7,129,871 B1 * | 10/2006 | Venes et al. ................ 341/136 |

FOREIGN PATENT DOCUMENTS

JP          04-219025          8/1992

OTHER PUBLICATIONS

*Takahiro Miki et al., "An 80-MHz 8-bit CMOS D/A Converter", IEEE Journal of Solid-State Circuits, vol. SC-21, No. 6, Dec. 6, 1986, pp. 983-988.
*David A. Johns et al., "Analog Integrated Circuit Design", John Wiley & Sons Inc., pp. 248-251, 259-260, no date.

* cited by examiner

*Primary Examiner*—Linh Nguyen
(74) *Attorney, Agent, or Firm*—Buchanan Ingersoll & Rooney PC (57) ABSTRACT

A current driven D/A converter sets an OFF control voltage (BIAS3) for turning off NMOS transistors M12P, M12N, M22P, M22N, M32P and M32N at a voltage close to an ON control voltage (BIAS2). This makes it possible to reduce the swing of the control voltage (ON control voltage-OFF control voltage) of the NMOS transistors, and hence to reduce the noise due to charge injections through parasitic capacitances, and noise of a ground voltage or power supply voltage due to flowing of discharge currents from the parasitic capacitances to the ground or power supply at turn off of the transistors, thereby being able to offer a high performance current driven D/A converter.

15 Claims, 8 Drawing Sheets

FIG.1

FIG.2B
PRACTICAL CIRCUIT OF
M31, M32P AND M32N

FIG.2A
PRACTICAL CIRCUIT OF
M21, M22P AND M22N

CURRENT DRIVEN D/A CONVERTER AND ITS BIAS CIRCUIT

BACKGROUND OF THE INVENTION

1. Field of the Invention

The present invention relates to a current driven D/A converter and its bias circuit.

2. Description of Related Art

Figure 7:
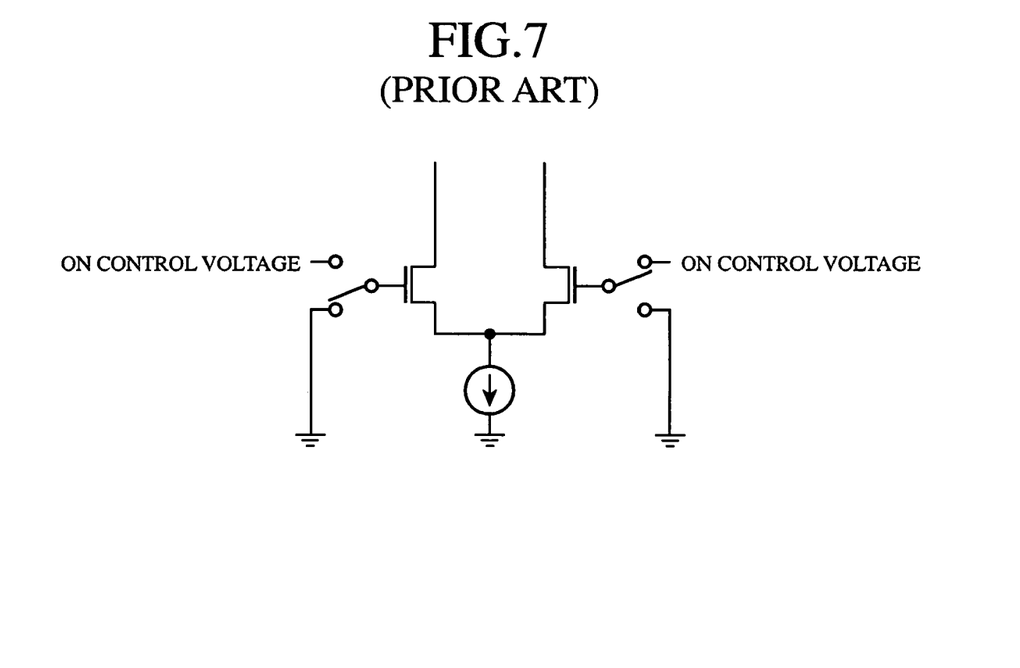
FIG. 7 is a diagram illustrating a conventional current driven D/A converter.

In a current driven D/A converter composed of MOS transistors, current switches are implemented by transistors. As shown in FIG. 7, a conventional current driven D/A converter, which employs NMOS transistors for current switches, uses a ground voltage as an OFF control voltage for turning off the current switches (see non-patent document 1, for example). To switch from ON to OFF state or vice versa, the gate electrodes of the switching transistors are supplied with an amplitude greater than a voltage at which the current switch actually switches off.

Figure 8:
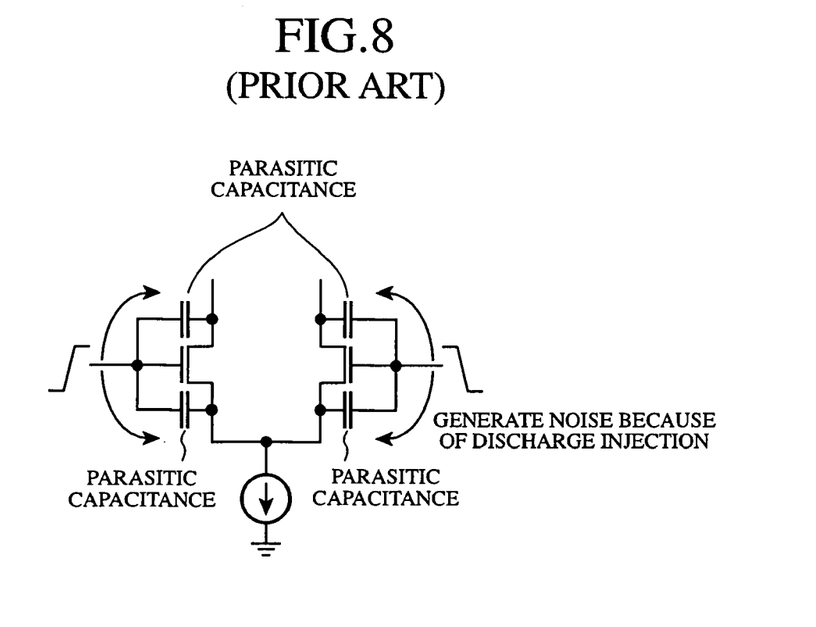
FIG. 8 is a diagram illustrating a conventional current driven D/A converter.

Accordingly, as shown in FIG. 8, charge injections greater than necessary takes place via parasitic capacitances of the switching transistors. This causes noise that brings about accuracy degradation and conversion rate restriction of the D/A converter.

Figure 9:
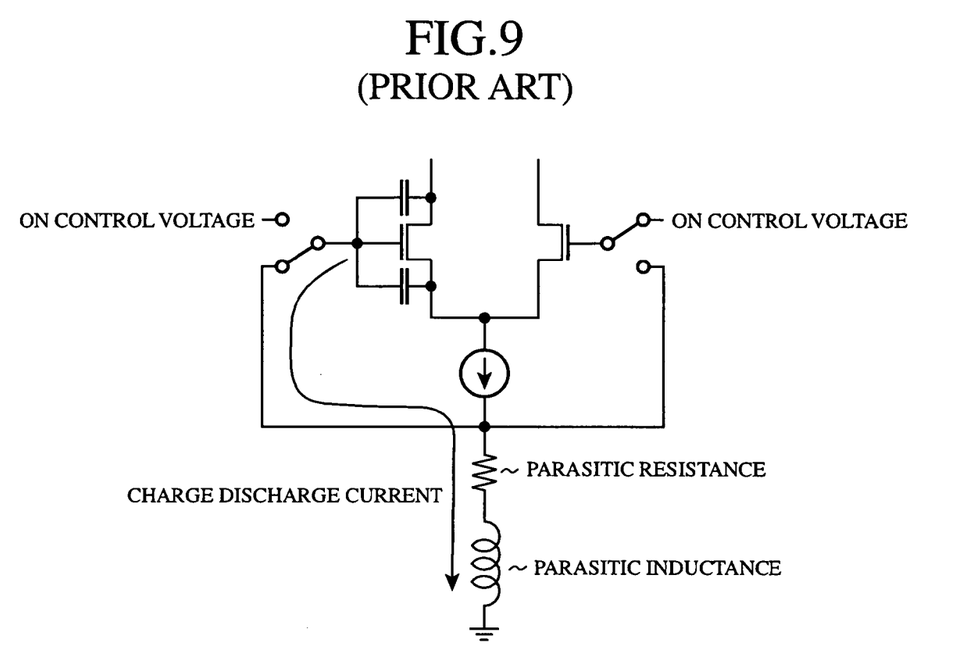
FIG. 9 is a diagram illustrating a conventional current driven D/A converter.

Furthermore, as shown in FIG. 9, in the switching transistor that is turning off from the ON state, charges stored in the parasitic capacitance in the ON state flow into a ground terminal at the moment it turns off. Thus, large charge discharge current flows instantaneously into the ground terminal. Because of the current and parasitic resistance and parasitic inductance of the ground terminal, the ground terminal voltage fluctuates, which brings about performance degradation of the D/A converter.

Likewise, in the switching transistors composed of PMOS transistors, large charge injections and noise of the power supply voltage occur.

Figure 10:
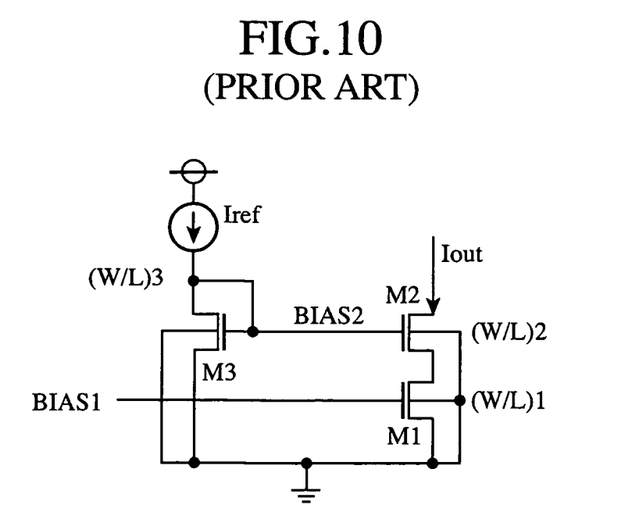
FIG. 10 is a diagram illustrating a bias circuit of a conventional cascode connection current source.

In addition, as shown in FIG. 10, in a current source (M1 and M2) connected in cascode, both the current source transistor M1 and cascode transistor M2 are used in the saturation region. Thus, the bias voltage of the cascode transistor M2 must be set in such a manner that the current source transistor M1 is saturated. Accordingly, the diode connection transistor M3 has been used as a bias circuit. When the transistors M2 and M3 have the same threshold voltage, the channel width/channel length ratio (W/L)3 of the transistor M3 for saturating the transistor M1 is obtained by the following expression (1).

$$(W/L)3 < \left(\frac{1}{1 + 1/\sqrt{K}}\right)^2 (W/L)1 \qquad (1)$$

where K=(W/L)2/(W/L)1. In this case, since (W/L)3 is determined by device sizes of (W/L)1 and (W/L)2, it can be determined accurately in a semiconductor integrated circuit.

In an actual circuit, however, the threshold voltages Vth2 and Vth3 of the transistors M2 and M3 differ because of the substrate bias effect. Thus, the condition of (W/L)3 for operating the transistor M1 in the saturation region is given by the following expression, which means that the condition depends on I0, Vth2 and Vth3.

$$(W/L)3 < \frac{1}{\left(\left(1 + 1/\sqrt{K}\right)\frac{1}{\sqrt{(W/L)1}}\right) + \frac{1}{\sqrt{2I0}}(Vth2 - Vth3)\right)^2} \qquad (2)$$

where Iout=Iref is set at I0. Accordingly, the bias voltage value must be generated with leaving sufficient margin considering fabrication variations in I0, Vth2 and Vth3. Thus, it is difficult for a low voltage circuit or a circuit with a small M2 drain voltage to achieve the conditions.

Non-patent document 1: "An 80-MHZ 8-bit CMOS D/A Converter", IEEE J. Solid-State Circuits, vol. SC-21, pp. 983-988, December 1986.

With the foregoing configuration, the conventional current driven D/A converter has noise occurring because of the charge injections caused by the unnecessarily large amplitude of the control voltage of the current switches of the current driven D/A converter, which becomes a factor of the performance degradation.

In addition, the large charge discharge current flows from the gate electrodes of the switching transistors into the ground or power supply terminal instantaneously when turning off the transistors. This causes noise in the ground voltage or in the power supply voltage, which offers a problem of the performance degradation of the D/A converter.

Furthermore, because of the variations in the threshold voltage Vth due to the substrate bias effect, the bias circuit of the conventional cascode connection current source must generate the bias voltage with leaving sufficient margin considering the fabrication variations in the current value and Vth. Thus, in the low voltage circuit or in the circuit with a small output voltage of the current source, a problem arises in that it is difficult to configure the bias circuit that meets the saturation conditions of the transistors.

SUMMARY OF THE INVENTION

The present invention is implemented to solve the foregoing problems. It is therefore an object of the present invention to provide a high performance current driven D/A converter by reducing the noise caused by the control voltages of the current switch transistors, and by reducing the noise in the ground or power supply voltage occurring at the turn off of the current switches.

Another object of the present invention is to provide a bias circuit of a current driven D/A converter capable of providing a high performance current driven D/A converter by generating appropriate bias voltages (control voltages) regardless of the fabrication variations in the current value and threshold voltage.

The current driven D/A converter in accordance with the present invention sets an OFF control voltage for turning off a current switch connected to a current source at a voltage close to an ON control voltage for turning on the current switch.

According to the present invention, setting the OFF control voltage of the current switch at the voltage close to the ON control voltage makes it possible to reduce the swing of the control voltage (ON control voltage—OFF control voltage) of the current switch. Thus, it can reduce the noise due to the charge injections through parasitic capacitances, and noise of ground voltage or power supply voltage due to flowing of the discharge current from the parasitic capacitances to the ground or power supply at the turn off, thereby offering an advantage of being able to provide a high performance current driven D/A converter.

DETAILED DESCRIPTION OF THE PREFERRED EMBODIMENTS

The invention will now be described with reference to the accompanying drawings.

Embodiment 1

Figure 1:
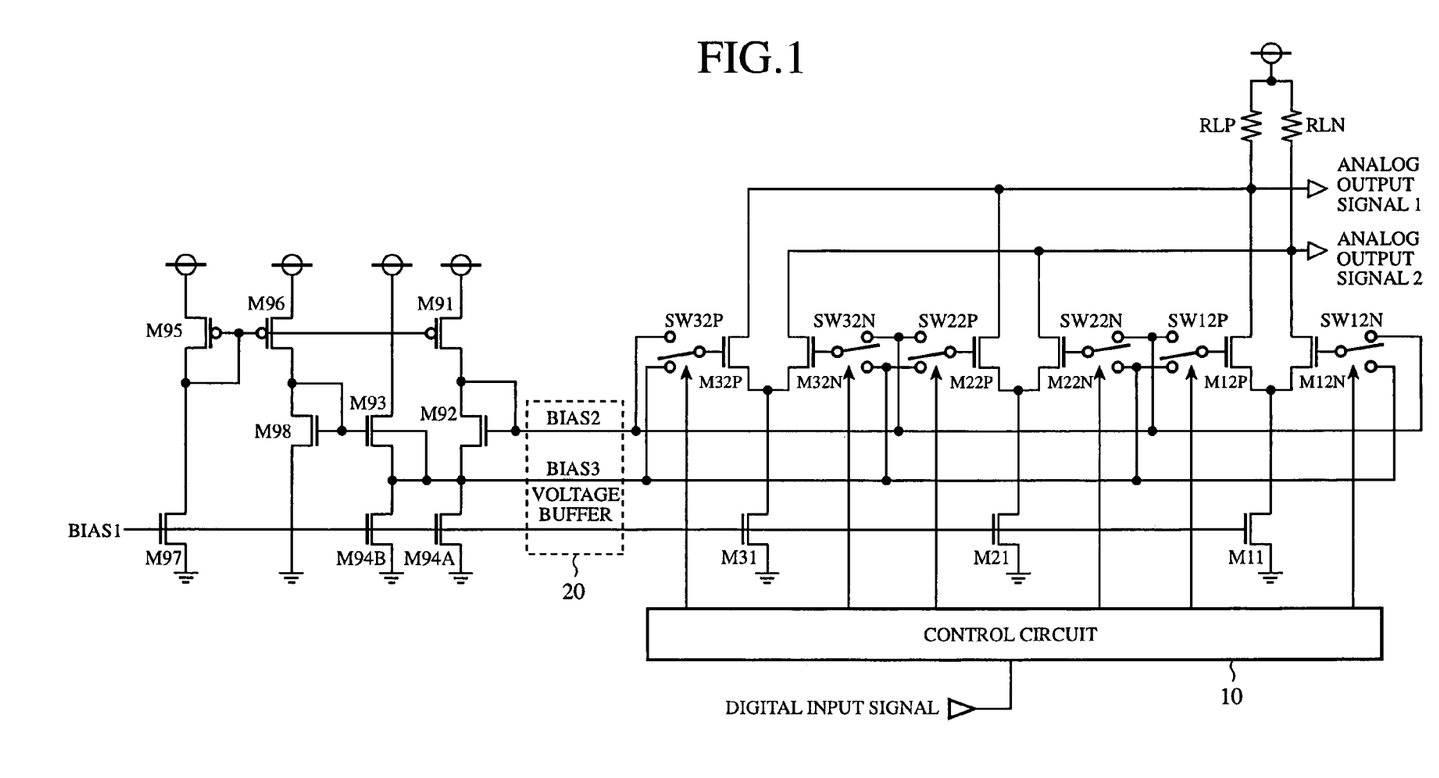
FIG. 1 is a circuit diagram showing a configuration of a current driven D/A converter of an embodiment 1 in accordance with the present invention.

FIG. 1 is a circuit diagram showing a configuration of a current driven D/A converter of an embodiment 1 in accordance with the present invention. The current driven D/A converter is an example of a 3-bit D/A converter.

In FIG. 1, load resistances RLP and RLN have their first ends connected to a power supply. An NMOS transistor (current switch) M12P has its drain electrode connected to a second end of the load resistance RLP, and its gate electrode connected to a switch SW12P to which bias voltages (control voltages) BIAS2 and BIAS3 are supplied. An NMOS transistor (current switch) M12N has its drain electrode connected to a second end of the load resistance RLN, and its gate electrode connected to a switch SW12N to which the bias voltages BIAS2 and BIAS3 are supplied. An NMOS transistor (current source) M11 has its drain electrode connected to a common source of the NMOS transistors M12P and M12N, its gate electrode supplied with a bias voltage BIAS1, and its source electrode connected to the ground.

The NMOS transistors M11, M12P and M12N constitute a current source cell for causing a current Ilsb corresponding to a 1 LSB to flow. In other words, the current source cell is composed of the NMOS transistor M11 operating as the current source, and the NMOS transistors M12P and M12N operating as current switches that turn on and off complementarily. The NMOS transistors M12P and M12N have the same size and the same electric characteristics.

An NMOS transistor (current switch) M22P has its drain electrode connected to the second end of the load resistance RLP, and its gate electrode connected to a switch SW22P to which the bias voltages BIAS2 and BIAS3 are supplied. An NMOS transistor (current switch) M22N has its drain electrode connected to the second end of the load resistance RLN, and its gate electrode connected to a switch SW22N to which the bias voltages BIAS2 and BIAS3 are supplied. An NMOS transistor (current source) M21 has its drain electrode connected to a common source of the NMOS transistors M22P and M22N, its gate electrode supplied with a bias voltage BIAS1, and its source electrode connected to the ground.

The NMOS transistors M21, M22P and M22N constitute a current source cell for causing a current 2×Ilsb to flow.

Figure 2A:
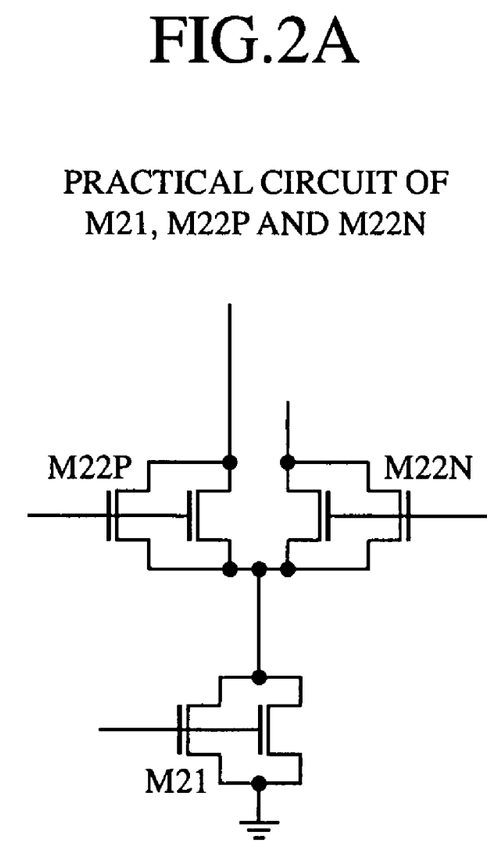
FIGS. 2A and 2B are circuit diagrams each showing a configuration of a current source cell.
Figure 2B:
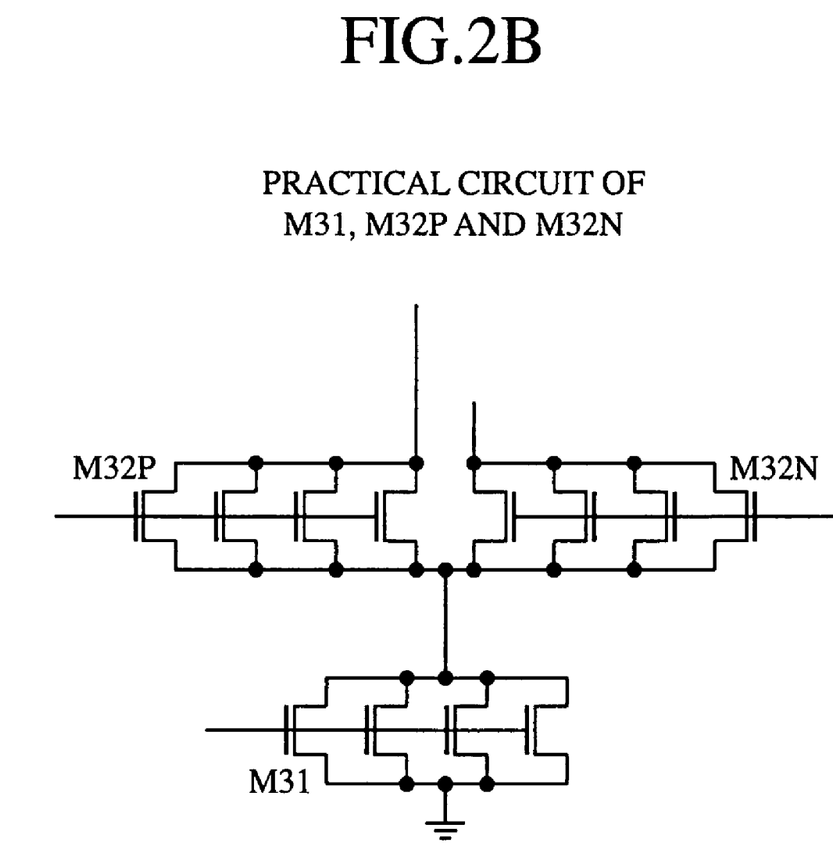

FIGS. 2A and 2B are circuit diagrams showing a configuration of the current source cell. As shown in FIG. 2A, the NMOS transistors M21, M22P and M22N are each implemented by connecting two NMOS transistors M11, M12P and M12N in parallel.

An NMOS transistor (current switch) M32P has its drain electrode connected to the second end of the load resistance RLP, and its gate electrode connected to a switch SW32P to which the bias voltages BIAS2 and BIAS3 are supplied. An NMOS transistor (current switch) M32N has its drain electrode connected to the second end of the load resistance RLN, and its gate electrode connected to a switch SW32N to which the bias voltages BIAS2 and BIAS3 are supplied. An NMOS transistor (current source) M31 has its drain electrode connected to a common source of the NMOS transistors M32P and M32N, its gate electrode supplied with a bias voltage BIAS1, and its source electrode connected to the ground.

The NMOS transistors M31, M32P and M32N constitute a current source cell for causing a current 4×Ilsb to flow. As shown in FIG. 2B, the NMOS transistors M31, M32P and M32N are each implemented by connecting four NMOS transistors M11, M12P and M12N in parallel.

The circuit configured that an analog output signal 1 is output from a connecting point of the second end of the load resistance RLP and the drain electrodes of the NMOS transistors M12P, M22P and M32P, and that an analog output signal 2 is output from a connecting point of the second end of the load resistance RLN and the drain electrodes of the NMOS transistors M12N, M22N and M32N.

In response to a 3-bit digital input signal, a control circuit 10 generates a control signal that turns on one of the switches SW×P and SW×N of each current source cell, and turns off the other of them. By connecting the output terminals of the current source cells, the current amounting to the sum total of the output currents of the current source cells are produced. The current is an 8-level analog signal current from a current value 0 to a 7×Ilsb. The current is converted to a voltage signal through the load resistances RLP and RLN, and the analog output signals 1 and 2 are output as the output signal of the D/A converter.

Transistors M91-M98 constitute a bias circuit for generating the bias voltages (control voltages) for the switching transistors of the current source cells. The bias circuit will now be described.

The PMOS transistor (first current source) M91 has its source electrode connected to a power supply (first voltage source). The NMOS transistor (first NMOS transistor) M92 has its gate electrode and drain electrode connected to the drain electrode of the PMOS transistor M91 and to the switches SW×P and SW×N so that it can supply the bias voltage BIAS2. The NMOS transistor (second NMOS transistor) M93 has its source electrode and back gate electrode connected to the source electrode of the NMOS transistor M92, its drain electrode connected to a power supply (second voltage source), and its gate electrode connected to a reference voltage terminal. The common source of the NMOS transistors M92 and M93 is connected to the switches SW×P and SW×N so that it can supply the bias voltage BIAS3. The NMOS transistors (second current source) M94A and M94B have their drain electrodes connected to the common source of the NMOS transistors M92 and M93, and their source electrodes connected to the ground (third voltage source). The NMOS transistors M94A and M94B have their gate electrodes supplied with the bias voltage BIAS1.

The PMOS transistors M95 and M96 have their source electrodes connected to a power supply, and their gate electrodes together with the drain electrode of the PMOS transistor M95 connected to the gate electrode of the PMOS transistor M91. The NMOS transistor M97 has its drain electrode connected to the drain electrode of the PMOS transistor M95, its gate electrode supplied with the bias voltage BIAS1, and its source electrode connected to the ground. The NMOS transistor M98 has its drain electrode and gate electrode (reference voltage terminal) connected to the drain electrode of the PMOS transistor M96 and to the gate electrode of the NMOS transistor M93, and its source electrode connected to the ground.

The NMOS transistors M94A, M94B and M97 have the same size as the NMOS transistor M11. They share the gate electrodes to which the bias voltage BIAS1 is applied so that the current Ilsb flows. The PMOS transistors M95, M96 and M91 constitute a current mirror circuit, so that the current Ilsb flowing through the PMOS transistor M95 also flows through the PMOS transistors M96 and M91. The NMOS transistor M92 has the same size as the NMOS transistors M12P and M12N. The current value flowing through the NMOS transistor M94A and NMOS transistor M92 is Ilsb. Accordingly, the NMOS transistor M94A and NMOS transistor M92 constitute a replica circuit of the conducting switching transistor side of each current source cell. The bias voltage BIAS2 is a bias voltage applied to the gate electrodes of the conducting switching transistor sides, and the bias voltage BIAS3 is a bias voltage applied to the gate electrodes of the non-conducting switching transistor sides. The NMOS transistor M93 has the same size as the NMOS transistor M11, and has its back gate electrode connected to the source electrode of the NMOS transistor M93. As for the back gate electrodes of the transistors other than the NMOS transistor M93, those of the NMOS transistors are connected to the ground, and those of the PMOS transistors are connected to the power supply.

Next, the operation will be described.

The NMOS transistor M11 of the current source cell must operate in the saturation region (that is, when Vgs is constant and Vds is large enough, Id becomes constant regardless of Vds) The condition for the NMOS transistor M11 to be placed in saturation is given by the following expression (3).

$$Vds11 > Vgs11 - Vth11 \quad (3)$$

where Vgs11 is the gate-source voltage of the NMOS transistor M11, Vds11 is the drain-source voltage of the NMOS transistor M11, and Vth11 is the threshold voltage of the NMOS transistor M11. The voltage value Vds11 is equal to the corresponding bias voltage BIAS3 of the replica circuit composed of the NMOS transistors M94A and M92. In addition, since Vgs11=Vgs94A, and Vth11=Vth94A, the NMOS transistor M11 operates in the saturation region, when the following condition is satisfied.

$$BIAS3 > Vgs94A - Vth94A \quad (4)$$

The BIAS3 is given by the following expression (5).

$$BIAS3 = Vgs98 - Vgs93 \quad (5)$$

where Vgs98 and Vgs93 are gate-source voltages of the NMOS transistors M98 and M93. As for the NMOS transistor M93, it has the same size as the NMOS transistor M94A, its drain current is Ilsb, and its source electrode and back gate electrode are connected to the same terminal so that it is free from the substrate bias effect. Thus, it exhibits the same electric characteristics as the NMOS transistor M94A, and hence $$Vgs93 = Vgs94A \quad (6)$$

From the foregoing expressions (4)-(6), the conditions for placing the NMOS transistor M11 in saturation can be summarized in the following expression (7).

$$Vgs98 > 2 \times Vgs94A - Vth94A$$

$$Vgs98 > 2 \times (Vgs94A - Vth94A) + Vth94A \quad (7)$$

Since the NMOS transistor M98 is free from the substrate bias effect, Vth98=Vth94A.

The current of a MOS transistor is given by the following expression.

$$Id = \frac{1}{2} \mu n Cox \frac{W}{L} (Vgs - Vth)^2 \quad (8)$$

where μn is the mobility of electrons, and Cox is the gate capacitance per unit area.

From the foregoing expression (8), the following expression is obtained.

$$Vgs - Vth = \sqrt{\frac{2Id}{\mu n Cox} \frac{L}{W}} \quad (9)$$

Thus, the foregoing expression (7) can be achieved by making the W/L ratio of the NMOS transistor M98 equal to or less than ¼ of the W/L ratio of the NMOS transistor M94A.

In this way, the conditions for operating the NMOS transistor M11 in the saturation region can be determined only by the size ratio of the transistors. Since the size ratio of the transistors can be fabricated at high accuracy in the integrated circuit, it is easily implemented. In addition, since the NMOS transistors M93 and M98 are free from the substrate bias effect, they are free from the changes in the threshold voltage Vth and current involved in fabrication variations and changes in the operation environment. Thus, the margins required by the conventional circuit can be reduced, and hence the operation of a circuit with a lower power supply voltage becomes possible.

As for the current source cells composed of the NMOS transistors M21, M22P and M22N, and of the NMOS transistors M31, M32P and M32N, they saturate in similar conditions.

In addition, since Vds11=BIAS3, in the NMOS transistors M12P, M12N, M22P, M22N, M32P and M32N which are turned off when the bias voltage BIAS3 is applied, the gate-source voltages become zero, and the current does not flow if the threshold voltage is positive.

Thus, the NMOS transistors M12P, M12N, M22P, M22N, M32P and M32N have their gates supplied with the voltage that swings from the bias voltage BIAS2 to BIAS3. Conventionally, the ground voltage is used as the OFF voltage. Since the voltage range that swings is reduced in the present embodiment, the charge injection quantities flowing through the parasitic capacitances of the NMOS transistors M12P, M12N, M22P, M22N, M32P and M32N are reduced. Consequently, the noise of the D/A converter is reduced, and the performance such as the S/N ratio and operation speed is improved.

Furthermore, in the conventional circuit, large charge discharge currents flow instantaneously to the ground through the switching transistors that turn from the ON state to the OFF state. However, in the present embodiment 1, since the current does not flow directly to the ground, the noise produced at the ground is reduced, thereby further improving the S/N ratio and operation speed.

Although FIG. 1 shows the current driven D/A converter composed of the NMOS transistors, the current driven D/A converter can also be composed of PMOS transistors.

Figure 3:
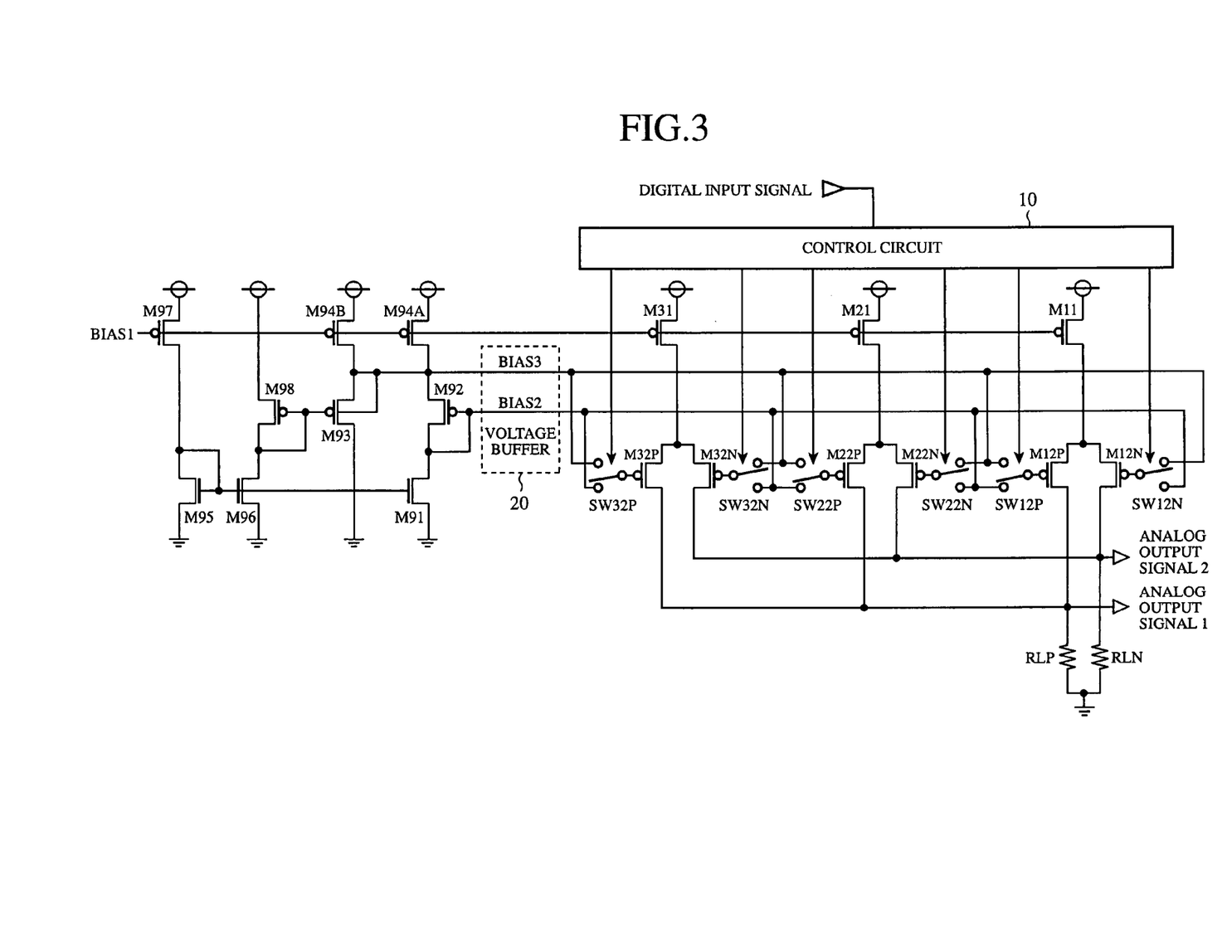
FIG. 3 is a circuit diagram showing another configuration of the current driven D/A converter of the embodiment 1 in accordance with the present invention.

FIG. 3 is a circuit diagram showing another configuration of the current driven D/A converter of the embodiment 1 in accordance with the present invention, in which the 3-bit D/A converter is composed of the PMOS transistors.

Comparing the configuration of FIG. 3 with that of FIG. 1, although the connection is reversed between the power supply and the ground because the NMOS transistors are replaced by the PMOS transistors, and the PMOS transistors are replaced by the NMOS transistors, the remaining configuration is equivalent to that of FIG. 1.

Such a circuit configuration can achieve the same effect as that of FIG. 1.

As described above, according to the present embodiment 1, the OFF control voltage of the NMOS transistors or PMOS transistors M12P, M12N, M22P, M22N, M32P and M32N is set at a voltage closer to the ON control voltage. As a result, the present embodiment 1 can reduce the swing of the control voltage of the NMOS transistors or PMOS transistors, reduce the noise due to the charge injections through the parasitic capacitances, and reduce the noise of the ground voltage or power supply voltage because of the flowing of the discharge current from the parasitic capacitances into the ground or power supply at the turn off of the transistors, thereby being able to implement the high performance current driven D/A converter.

In addition, the OFF control voltage is set in such a manner that the gate-source voltages that turn off the NMOS transistors or PMOS transistors M12P, M12N, M22P, M22N, M32P and M32N become zero volt. As a result, the present embodiment 1 can further reduce the swing of the control voltage, and reduce the noise due to the parasitic capacitance, thereby being able to implement a higher performance current driven D/A converter.

Besides, the present embodiment 1 can generate the bias voltages free from the effect of the threshold voltage due to the substrate bias effect, and can configure a bias circuit that satisfies the saturation conditions of the D/A converter that operates at the low voltage and has the low output voltage of the current source, thereby being able to implement the high performance current driven D/A converter.

Furthermore, it is also possible in FIG. 1 to insert the current mirror (current mirror circuit) into the drain electrodes of the NMOS transistors M92 and M93 to cause the current equal to the drain current of the NMOS transistor M93 to flow through the NMOS transistor M92. Although it is necessary in this case to set the current ratio between the PMOS transistor M91 and the NMOS transistors M94A and M94B at high accuracy, using the current mirror circuit can achieve it with a small circuit easily.

In addition, it is also possible in FIG. 3 to insert the current mirror (current mirror circuit) into the drain electrodes of the PMOS transistors M92 and M93 to cause the current equal to the drain current of the PMOS transistor M93 to flow through the PMOS transistor M92. Although it is necessary in this case to set the current ratio between the NMOS transistor M91 and the PMOS transistors M94A and M94B at high accuracy, using the current mirror circuit can achieve it with a small circuit easily.

Besides, although the bias circuits of the current driven D/A converters as shown in FIGS. 1 and 3 are applicable as the control voltage supply for the current source cells of the current driven D/A converters as shown in FIGS. 1 and 3, the bias circuits are also applicable as the control voltage supply of the current source cells of other current driven D/A converters.

Furthermore, it is also possible to provide a voltage buffer 20 to the output stage of the bias circuit of the current driven D/A converter as shown in FIGS. 1 and 3, and to supply the bias voltages via the voltage buffer to the current source cells of the current driven D/A converter as the control voltage. The voltage buffer 20 installed at the output stage of the bias circuit can reduce the output impedance of the bias circuit, thereby being able to provide the bias voltage unsusceptible to the effect of noise.

Embodiment 2

Figure 4:
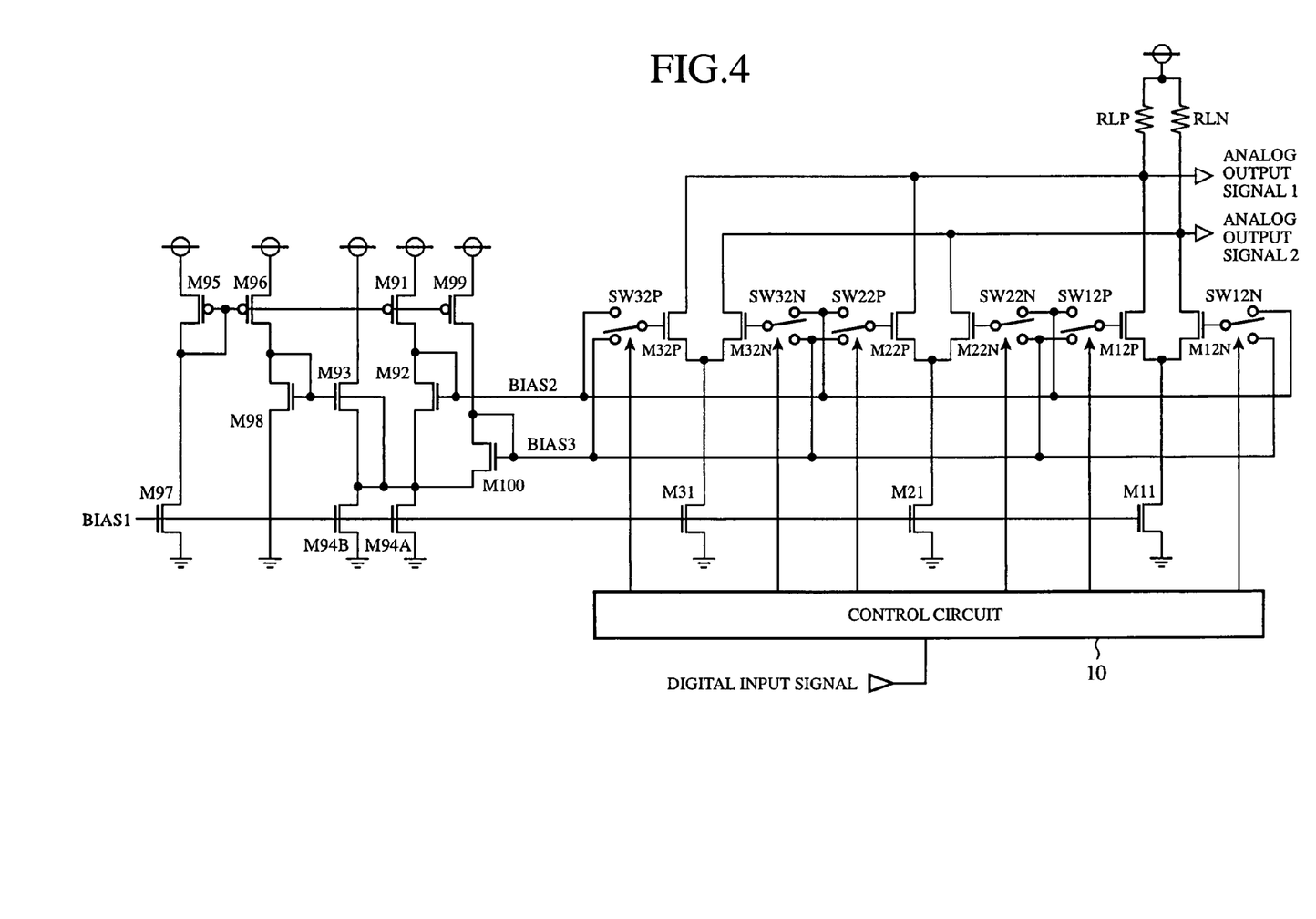
FIG. 4 is a circuit diagram showing a configuration of a current driven D/A converter of an embodiment 2 in accordance with the present invention.

FIG. 4 is a circuit diagram showing a configuration of the current driven D/A converter of an embodiment 2 in accordance with the present invention. In FIG. 4, a PMOS transistor M99 has its source electrode connected to a power supply, and its gate electrode connected to the gate electrodes of the PMOS transistors M95, M96 and M91, thereby configuring a current mirror circuit. An NMOS transistor M100 has its drain electrode and gate electrode connected to the drain electrode of the PMOS transistor M99 to supply the bias voltage BIAS3 to the current source cells, its source electrode connected to the source electrode of the NMOS transistor M92 and to the source electrode and back gate electrode of the NMOS transistor M93. The remaining configuration is the same as that of FIG. 1.

Next, the operation will be described.

In FIG. 4, the bias voltage BIAS3 is generated by the PMOS transistor M99 and NMOS transistor M100. The gate-source voltage of the NMOS transistor M100 can be adjusted to the threshold voltage Vth of the NMOS transistor M100 by flowing a minute current through the NMOS transistor M100 by adjusting the size of the PMOS transistor M99. In this case, the swing range of the gate voltages of the switching transistors become smaller, thereby being able to further reduce the charge injection quantity.

Although FIG. 4 shows the current driven D/A converter composed of the NMOS transistors, the current driven D/A converter can also be composed of PMOS transistors.

Figure 5:
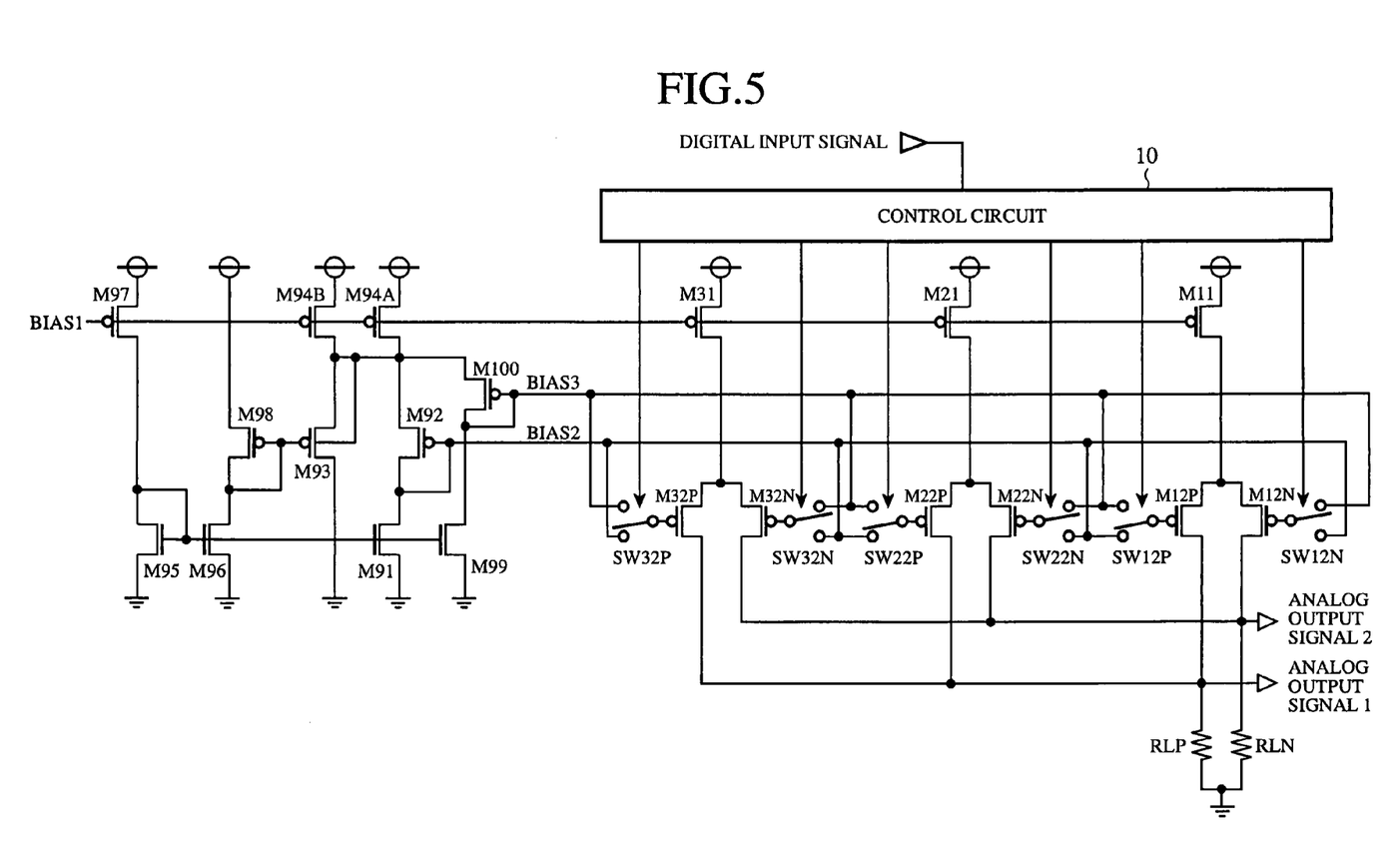
FIG. 5 is a circuit diagram showing another configuration of the current driven D/A converter of the embodiment 2 in accordance with the present invention.

FIG. 5 is a circuit diagram showing another configuration of the current driven D/A converter of the embodiment 2 in accordance with the present invention, in which the 3-bit D/A converter is composed of the PMOS transistors.

Comparing the configuration of FIG. 5 with that of FIG. 4, although the connection is reversed between the power supply and the ground because the NMOS transistors are replaced by the PMOS transistors, and the PMOS transistors are replaced by the NMOS transistors, the remaining configuration is equivalent to that of FIG. 4.

Such a circuit configuration can achieve the same effect as that of FIG. 4.

As described above, according to the present embodiment 2, the OFF control voltage is set in such a manner that the gate-source voltages of the NMOS transistors or PMOS transistors M12P, M12N, M22P, M22N, M32P and M32N become equal to the threshold voltage of the NMOS transistors or PMOS transistors. As a result, the present embodiment 2 can further reduce the swing of the control voltage, and reduce the noise due to the parasitic capacitance, thereby being able to implement the higher performance current driven D/A converter.

Embodiment 3

Figure 6:
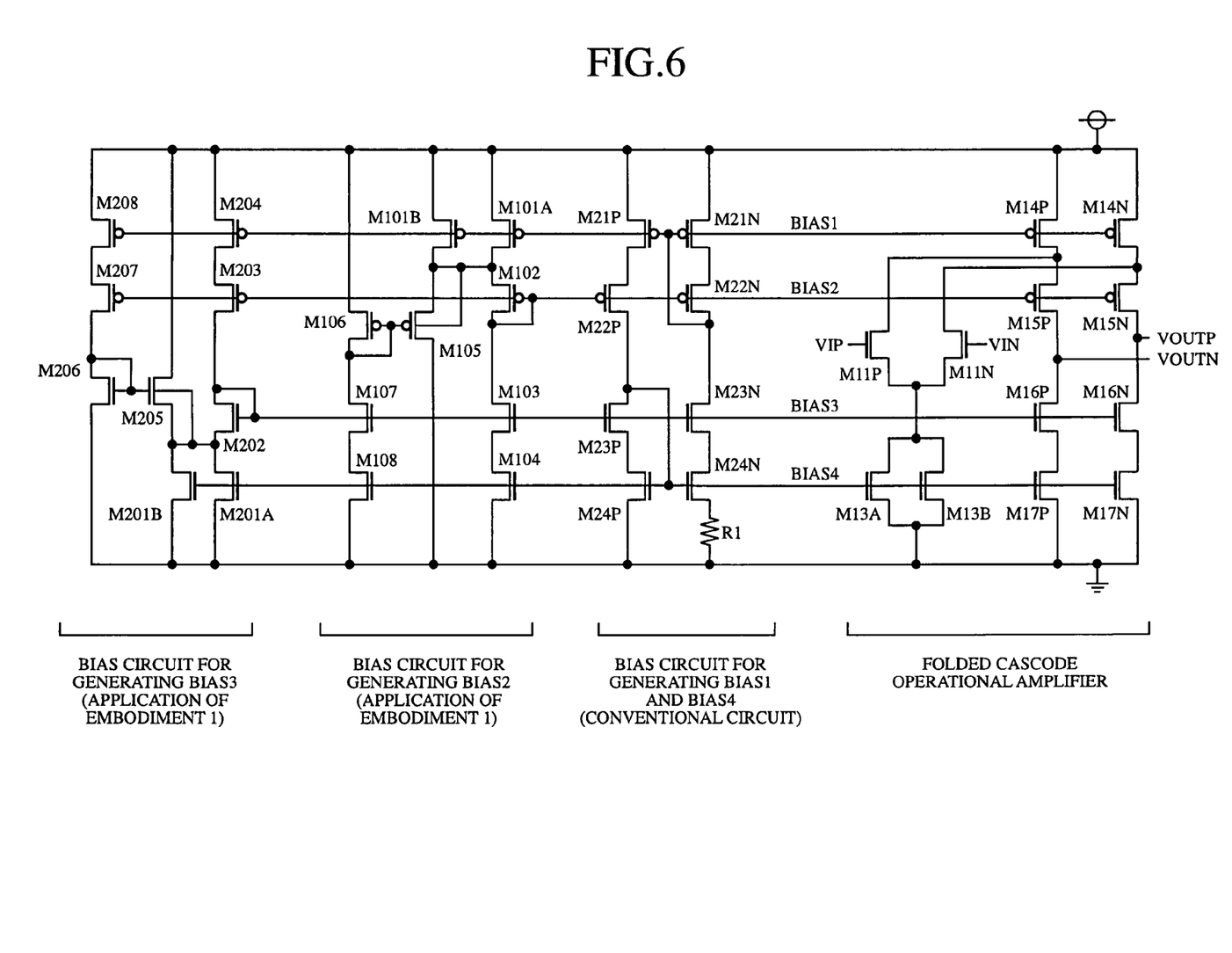
FIG. 6 is a circuit diagram showing a configuration of a folded cascode operational amplifier to which a current driven D/A converter of the embodiment 3 in accordance with the present invention is applied.

FIG. 6 is a circuit diagram showing a configuration of a folded cascode operational amplifier to which the current driven D/A converter of an embodiment 3 in accordance with the present invention is applied. In FIG. 6, the folded cascode operational amplifier includes a differential pair composed of NMOS transistors M11P and M11N and a differential pair composed of NMOS transistors M13A and M13B, and an output stage composed of PMOS transistors M14P, M14N, M15P and M15N and NMOS transistors M16P, M16N, M17P and M17N. Input voltages VIP and VIN are applied to the gate electrodes of the NMOS transistors M11P and M11N. An output voltage VOUTP is output from between the PMOS transistor M15N and NMOS transistor M16N, and an output voltage VOUTN is output from between the PMOS transistor M15P and NMOS transistor M16P. In the folded cascode operational amplifier, all the transistors must operate in the saturation region.

A bias circuit (conventional circuit) composed of PMOS transistors M21P, M21N, M22P and M22N, and NMOS transistors M23P, M23N, M24P and M24N, and a resistor R1 generates a bias voltage BIAS1 and a bias voltage BIAS4.

A bias circuit (employing the embodiment 1) composed of PMOS transistors M101A, M101B, M102, M105 and M106, and NMOS transistors M103, M104, M107 and M108 is provided for generating the bias voltage BIAS2. The circuit, which operates in the same manner as the bias circuit of the current driven D/A converter of the embodiment 1, is free from the substrate bias effect. Accordingly, it can easily generate the bias voltage that saturates the PMOS transistors M14P and M14N independently of the fabrication variations and operation environment.

A bias circuit (employing the embodiment 1) composed of PMOS transistors M203, M204, M207 and M208, and NMOS transistors M201A, M201B, M202, M205 and M206 is provided for generating the bias voltage BIAS3. The circuit, which is also free from the substrate bias effect, can easily generate the bias voltage that saturates the PMOS transistors M17P and M17N independently of the fabrication variations and operation environment.

As described above, the present embodiment 3 employs the bias circuit of the embodiment 1 as the bias circuits for generating the bias voltages BIAS2 and BIAS3. As a result, since it is free from the substrate bias effect, the present embodiment 3 can easily generate the bias voltages that saturate the transistors easily independently of the fabrication variations or the operation environment in the folded cascode operational amplifier.

What is claimed is:

1. A bias circuit of a current driven D/A converter comprising:
   a first current source having its first end connected to a first voltage source;
   a first NMOS transistor having its gate electrode and drain electrode connected to a second end of said first current source;
   a second NMOS transistor having its source electrode and back gate electrode connected to a source electrode of said first NMOS transistor, its drain electrode connected to a second voltage source, and its gate electrode connected to a reference voltage terminal; and
   a second current source having its first end connected to source electrodes of said first and second NMOS transistors, and its second end connected to a third voltage source.

2. The bias circuit of a current driven D/A converter according to claim 1, further comprising a current mirror circuit inserted into the drain electrodes of said first and second NMOS transistors to cause a same current value as a drain current of said second NMOS transistor to flow through said first NMOS transistor.

3. A bias circuit of a current driven D/A converter comprising:
   a first current source having its first end connected to a first voltage source;
   a first PMOS transistor having its gate electrode and drain electrode connected to a second end of said first current source;
   a second PMOS transistor having its source electrode and back gate electrode connected to a source electrode of said first PMOS transistor, its drain electrode connected to a second voltage source, and its gate electrode connected to a reference voltage terminal; and
   a second current source having its first end connected to source electrodes of said first and second PMOS transistors, and its second end connected to a third voltage source.

4. The bias circuit of a current driven D/A converter according to claim 3, further comprising a current mirror circuit inserted into the drain electrodes of said first and second PMOS transistors to cause a same current value as a drain current of said second PMOS transistor to flow through said first PMOS transistor.

5. A current driven D/A converter that sets an OFF control voltage for tuning off a current switch connected to a current source at a voltage close to an ON control voltage for turning on the current switch, further comprising a bias circuit for generating bias voltages to e used as the ON control voltage and the OFF control voltage, said bias circuit comprising:
   a first current source having its first end connected to a first voltage source;
   a first MOS transistor having its gate electrode and drain electrode connected to a second end of said first current source;
   a second MOS transistor having its source electrode connected to a source electrode of said first MOS transistor, and its gate electrode connected to a reference voltage terminal; and
   a second current source having its first end connected to source electrodes of said first and second MOS transistors, and its second end connected to a second voltage source.

6. The current driven D/A converter according to claim 5, further comprising a voltage buffer at an output stage of said bias circuit, wherein bias voltages output via the voltage buffer is used as the ON control voltage and the OFF control voltage.

7. The current driven D/A converter according to claim 5, wherein said first and second MOS transistors are NMOS transistors.

8. The current driven D/A converter according to claim 5, wherein said first and second MOS transistors are PMOS transistors.

9. The current driven D/A converter according to claim 5, further comprising a current mirror circuit inserted into the drain electrodes of said first and second MOS transistors to cause a same current value as a drain current of said second MOS transistor to flow through said first MOS transistor.

10. A bias circuit of a current driven D/A converter comprising:
    a first current source having its first end connected to a first voltage source;
    a first NMOS transistor having its gate electrode and drain electrode connected to a second end of said first current source;
    a second NMOS transistor having its source electrode connected to a source electrode of said first NMOS transistor, and its gate electrode connected to a reference voltage terminal; and a second current source having its first end connected to source electrodes of
    said first and second NMOS transistors, and its second end connected to a second voltage source.

11. The bias circuit of a current driven D/A converter according to claim 10, further comprising a current mirror circuit inserted into the drain electrodes of said first and second NMOS transistors.

12. A bias circuit of a current driven D/A converter comprising:
    a first current source having its first end connected to a first voltage source;
    a first PMOS transistor having its gate electrode and drain electrode connected to a second end of said first current source;
    a second PMOS transistor having its source electrode connected to a source electrode of said first PMOS transistor, and its gate electrode connected to a reference voltage terminal; and
    a second current source having its first end connected to source electrodes of said first and second PMOS transistors, and its second end connected to a second voltage source.

13. The bias circuit of a current driven D/A converter according to claim 12, further comprising a current mirror circuit inserted into the drain electrodes of said first and second PMOS transistors.

14. A bias circuit of a current driven D/A converter comprising:
    a first current source having its first end connected to a first voltage source;
    a first MOS transistor having its gate electrode and drain electrode connected to a second end of said first current source;
    a second MOS transistor having its source electrode connected to a source electrode of said first MOS transistor, and its gate electrode connected to a reference voltage terminal; and
    a second current source having its first end connected to source electrodes of said first and second MOS transistors, and its second end connected to a second voltage source.

15. The bias circuit of a current driven D/A converter according to claim 14, further comprising a current mirror circuit inserted into the drain electrodes of said first and second MOS transistors.

* * * * *